(12) United States Patent
Park et al.

(10) Patent No.: US 7,268,372 B2
(45) Date of Patent: Sep. 11, 2007

(54) VERTICAL GAN LIGHT EMITTING DIODE AND METHOD FOR MANUFACTURING THE SAME

(75) Inventors: Young Ho Park, Kyungki-do (KR); Hun Joo Hahm, Kyungki-do (KR); J ong Seok Na, Seoul (KR); Seung Jin Yoo, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/601,597

(22) Filed: Jun. 24, 2003

(65) Prior Publication Data

US 2005/0173692 A1    Aug. 11, 2005

(30) Foreign Application Priority Data

Dec. 27, 2002    (KR)    ............... 10-2002-0084703

(51) Int. Cl.
*H01L 29/24*    (2006.01)
*H01L 33/00*    (2006.01)

(52) U.S. Cl. ............... 257/103; 257/79; 257/98

(58) Field of Classification Search ............... 257/13, 257/79–103, 918
See application file for complete search history.

(56) References Cited

U.S. PATENT DOCUMENTS

| | | | | |
|---|---|---|---|---|
| 5,226,053 A | * | 7/1993 | Cho et al. | ............... 372/45 |
| 5,665,986 A | * | 9/1997 | Miura et al. | ............... 257/96 |
| 5,766,740 A | * | 6/1998 | Olson | ............... 428/209 |
| 6,169,296 B1 | | 1/2001 | Kamiyama et al. | |
| 6,492,661 B1 | * | 12/2002 | Chien et al. | ............... 257/98 |

| | | | |
|---|---|---|---|
| 2004/0209542 A1 | * | 10/2004 | Ishida ............... 445/24 |

FOREIGN PATENT DOCUMENTS

| | | | |
|---|---|---|---|
| JP | 09-008403 | | 1/1997 |
| JP | 10-041586 | | 2/1998 |
| JP | 11-068157 | * | 3/1999 |
| JP | 2000174333 A | * | 6/2000 |
| JP | 2001-339100 | * | 7/2001 |
| JP | 2002-299683 | | 10/2002 |
| JP | 2002-368266 | | 12/2002 |
| KR | 1999-37429 | | 5/1999 |

OTHER PUBLICATIONS

Merriam-Webster Online Dictionary, definition for "alloy", Nov. 23, 2005.*
Joseph B. Long, "Tin", in AccessScience@McGraw-Hill, http:www.accessscience.com, DOI10.1036/1097-8542.697900, last modified: Jul. 15, 2002.*

* cited by examiner

*Primary Examiner*—Monica Lewis
(74) *Attorney, Agent, or Firm*—Lowe Hauptman Ham & Berner

(57) ABSTRACT

Disclosed are a vertical GaN light emitting diode and a method for manufacturing the same. The vertical GaN light emitting diode comprises a first conductive GaN clad layer with an upper surface provided with a first contact formed thereon, an active layer formed on a lower surface of the first conductive GaN clad layer, a second conductive GaN clad layer formed on a lower surface of the active layer, a conductive adhesive layer formed on the second conductive GaN clad layer, and a conductive substrate, with a lower surface provided with a second contact formed thereon, formed on a lower surface of the conductive adhesive layer. The method for manufacturing the vertical GaN light emitting diodes comprises the step of removing the sapphire substrate from the light emitting structure so as to prevent the damages on a GaN single crystal plane of the structure.

9 Claims, 7 Drawing Sheets

Laser beam irradiation

VERTICAL GAN LIGHT EMITTING DIODE AND METHOD FOR MANUFACTURING THE SAME

BACKGROUND OF THE INVENTION

1. Field of the Invention

The present invention relates to a vertical GaN light emitting diode and a method for manufacturing the same, and more particularly to a vertical GaN light emitting diode, from which an insulating sapphire substrate with low thermal conductivity is removed and in which a conductive substrate such as a silicon substrate is installed so as to improve the luminance and the reliability of the diode, and a method for manufacturing the vertical GaN light emitting diode.

2. Description of the Related Art

Generally, light emitting diodes (LEDs) are semiconductor elements, which emit light based on the recoupling of electrons and holes, and are widely used as various types of light sources in optical communication and electronic equipment. GaN serves as a compound for manufacturing blue-light emitting diodes.

Frequency (or wavelength) of light emitted from the light emitting diode is functionally related to a band gap of a semiconductor material to be used. When the band gap is small, photons with low energy and a longer wavelength are generated. In order to generate photons with a shorter wavelength, there is required a semiconductor material with a broader band gap.

For example, AlGaInP commonly used in a laser beam emits light corresponding to visible red light (approximately 600~700 nm). On the other hand, silicon carbide (SiC) and Group III nitride semiconductor materials such as gallium nitride (GaN) with a comparatively broad band gap emit light corresponding to visible blue light or ultraviolet rays. A short wavelength LED has an advantage in increasing a storage space of an optical storage (approximately 4 times as large as that of a general LED emitting red light).

The same as other Group III nitride semiconductor materials for emitting blue light, there is no practical technique for forming a bulk single crystal made of GaN. Accordingly, there is required a substrate suitable for growing a GaN crystal thereon. Sapphire, i.e., aluminum oxide ($Al_2O_3$), is typically used as such a substrate for growing the GaN crystal thereon.

However, a sapphire substrate has an insulating property, thus limiting the structure of a GaN light emitting diode. With reference to FIG. 1, the structure of a conventional GaN light emitting diode is will be described in detail.

FIG. 1 is a cross-sectional view of a conventional GaN light emitting diode 10. The GaN light emitting diode 10 comprises a sapphire substrate 11 and a GaN light emitting structure 15 formed on the sapphire substrate 11.

The GaN light emitting structure 15 includes an n-type GaN clad layer 15a, an active layer 15b formed to have a multi-quantum well structure, and a p-type GaN clad layer 15c. Here, the n-type GaN clad layer 15a, the active layer 15b and the p-type GaN clad layer 15c are sequentially formed on the sapphire substrate 11. The light emitting structure 15 may be grown on the sapphire substrate 11 using MOCVD (metal-organic chemical vapor deposition), etc. Here, in order to improve the lattice matching of the light emitting structure 15 and the sapphire substrate 11, a buffer layer (not shown) made of AlN/GaN may be formed on the sapphire substrate 11 before the growing of the n-type GaN clad layer 15a.

The p-type GaN clad layer 15c and the active layer 15b are removed at designated portions by dry etching so as to selectively expose the upper surface of the n-type GaN clad layer 15a. An n-type contact 19 is formed on the exposed upper surface of the n-type GaN clad layer 15a, and a p-type contact 17 is formed on the upper surface of the p-type GaN clad layer 15c. A designated voltage is applied to the n-type contact 19 and the p-type contact 17. Generally, in order to increase a current injection area while not negatively affecting luminance, a transparent electrode 16 may be formed on the upper surface of the p-type GaN clad layer 15c before the forming the p-type contact 17 on the p-type GaN clad layer 15c.

As described above, since the conventional GaN light emitting diode 10 uses the insulating sapphire substrate 11, the two contacts 17 and 19 are formed on the sapphire substrate so that the contacts 17 and 19 are nearly horizontal with each other. Accordingly, when a voltage is applied to the conventional GaN light emitting diode 10, a current flows from the n-type contact 19 to the p-type contact 17 via the active layer 15b in a horizontal direction. Since a forward voltage ($V_f$) of the light emitting diode 10 is increased due to this narrow current flow, the current efficiency of the light emitting diode 10 is lowered and an electrostatic discharge effect is weak.

Further, the conventional GaN light emitting diode 10 emits a great amount of heat in proportion to the increase of the, current density. On the other hand, the sapphire substrate 11 has low thermal conductivity, thus not rapidly dissipating heat. Accordingly, mechanical stress is exerted between the sapphire substrate 11 and the GaN light emitting structure 15 due to the increased temperature, thus causing the GaN light emitting diode 10 to be unstable.

Moreover, in order to form the n-type contact 19, a portion of the active layer 15b with a size at least larger than that of the contact 19 to be formed must be removed. Accordingly, a light emitting area is reduced, and the luminous efficiency according to the luminance relative to the size of the diode 10 is lowered.

Therefore, there are required a GaN blue light emitting diode with improved luminance and reliability thereof, in which the above-described problems arising from the use of the sapphire substrate required to grow a GaN single crystal thereon are removed, and a method for manufacturing the GaN blue light emitting diode.

SUMMARY OF THE INVENTION

Therefore, the present invention has been made in view of the above problems, and it is an object of the present invention to provide a vertical GaN light emitting diode, from which an insulating sapphire substrate with low thermal conductivity is removed, and in which a conductive substrate is attached to a light emitting structure by a conductive adhesive layer and different types of contacts are formed on opposite surfaces of the light emitting structure.

It is another object of the present invention to provide a method for manufacturing vertical GaN light emitting diodes comprising the step of stably removing a sapphire substrate from a GaN single crystalline light emitting structure.

In accordance with one aspect of the present invention, the above and other objects can be accomplished by the provision of a GaN light emitting diode comprising: a first conductive GaN clad layer with an upper surface provided with a first contact formed thereon; an active layer formed on a lower surface of the first conductive GaN clad layer; a second conductive GaN clad layer formed on a lower surface of the active layer; a conductive adhesive layer formed on the second conductive GaN clad layer; and a conductive substrate, with a lower surface provided with a second contact formed thereon, formed on a lower surface of the conductive adhesive layer.

Preferably, the GaN light emitting diode may further comprise a reflective layer made of a conductive material and formed between the second conductive GaN clad layer and the conductive adhesive layer so as to improve the luminance of light emitted from the upper surface of the diode. The reflective layer may be made of a material selected from the group consisting of Au, Ni, Ag, Al and their alloys.

Further, preferably, the conductive substrate may be made of a material selected from the group consisting of silicon (Si), germanium (Ge) and GaAs, and the conductive adhesive layer may be made of a material selected from the group consisting of Au—Sn, Sn, In, Au—Ag and Pb—Sn.

Moreover, preferably, the first conductive GaN clad layer may be a GaN crystalline layer doped with an n-type impurity, and the second conductive GaN clad layer may be an GaN crystalline layer doped with a p-type impurity, so as to enhance the current density distribution.

In accordance with another aspect of the present invention, there is provided a method for manufacturing GaN light emitting diodes, comprising the steps of: (a) forming a light emitting structure on a sapphire substrate, the light emitting structure including a first conductive GaN clad layer, an active layer and a second conductive GaN clad layer sequentially stacked on the sapphire substrate; (b) cutting the light emitting structure into plural units so that each of the unit light emitting structures has a designated size; (c) attaching a conductive substrate to exposed upper surfaces of the unit light emitting structures using a conductive adhesive layer; (d) removing the sapphire substrate from the unit light emitting structures; (e) forming first and second contacts respectively on the surface of the first conductive clad layer, from which the sapphire substrate is removed, and the exposed surface of the conductive substrate; and (f) cutting the resulting structure provided with the first and second contacts into plural unit light emitting diodes.

Preferably, in the step (d), the sapphire substrate may be removed from the unit light emitting structures by irradiating a laser beam on the lower surface of the sapphire substrate. The size of each of the cut unit light emitting structures may be approximately the same as or smaller than the area of the irradiation of the laser beam, or may be approximately the same as or smaller than that of each of the cut unit light emitting diodes.

Further, preferably, in the step (c), the conductive adhesive layer may be formed on the lower surface of the conductive substrate in advance, and then the lower surface of the conductive substrate provided with the conductive adhesive layer may be attached to the exposed upper surfaces of the unit light emitting structures. Alternatively, in the step (c), the conductive adhesive layer may be formed on the exposed upper surfaces of the unit light emitting structures, and then the conductive substrate may be attached to the upper surfaces of the unit light emitting structures provided with the conductive adhesive layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
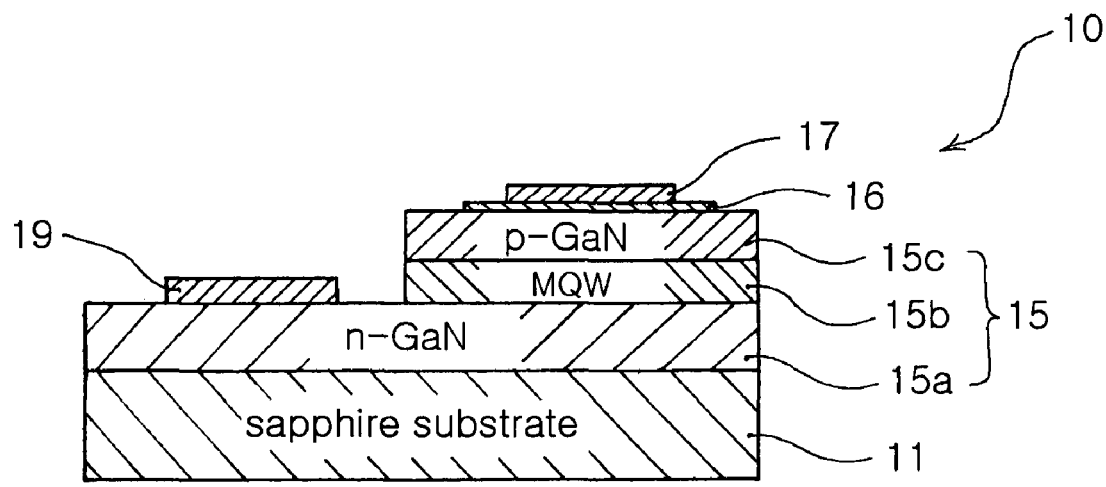
FIG. 1 is a schematic cross-sectional view of a conventional GaN light emitting diode.
Figure 2:
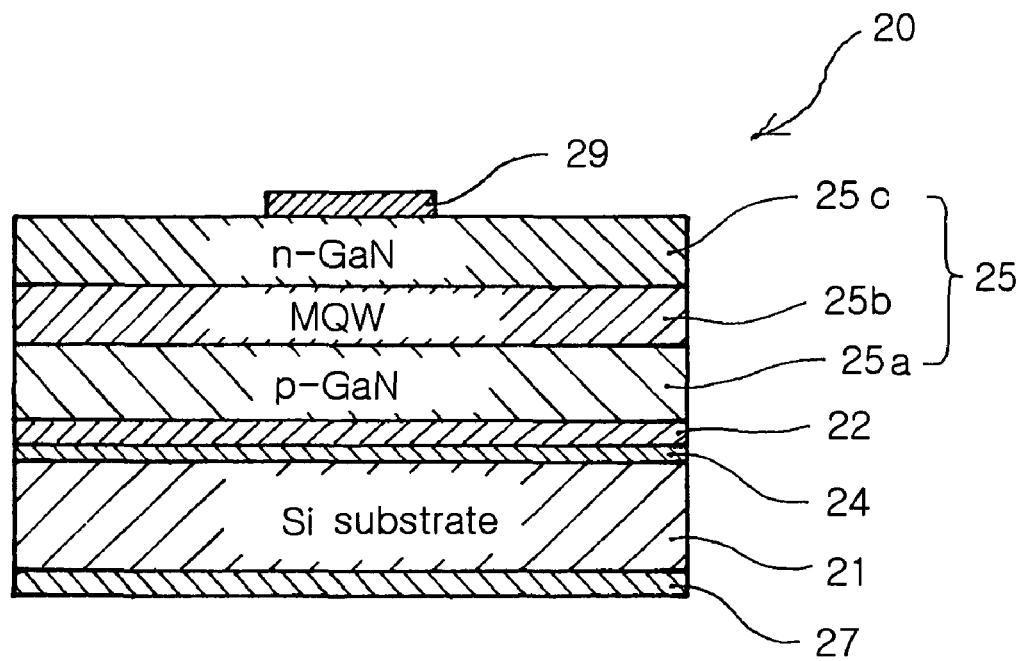
FIG. 2 is a schematic cross-sectional view of a vertical GaN light emitting diode in accordance with one embodiment of the present invention.

FIG. 2 is a cross-sectional view of a vertical GaN light emitting diode 20 in accordance with one preferred embodiment of the present invention.

The vertical GaN light emitting diode 40 comprises a light emitting structure 25 including a p-type GaN clad layer 25a, an active layer 25b, and an n-type GaN clad layer 25c. Further, the GaN light emitting diode 40 selectively comprises a reflective layer 22 formed on the lower surface of the p-type GaN clad layer 25a. The reflective layer 22 is attached to a silicon substrate 21 using a conductive adhesive layer 24. The reflective layer 22 serves to improve the effective luminance depending on light emitted from the upper surface of the GaN light emitting diode 20, and is made of a metal with high reflectivity. Preferably, the reflective layer 22 is made of a material selected from the group consisting of Au, Ni, Ag, Al and their alloys.

That is, the conductive adhesive layer 24 is formed on the lower surface of the reflective layer 22. First, the GaN single crystalline light emitting structure 25 of the present invention is grown on a sapphire substrate, and a conductive substrate is attached to the other side of the light emitting structure 25. Then, the vertical GaN light emitting diode 20 shown in FIG. 2 is obtained by removing the sapphire substrate from the light emitting structure 25.

Here, the conductive adhesive layer 24 is used to attach the silicon substrate 21 to the light emitting structure 25. The conductive adhesive layer 24 used in the present invention must be made of a conductive material with an adhesive property. Preferably, such a conductive material is a metal adhesive selected from the group consisting of Au—Sn, Sn, In, Au—Ag, and Pb—Sn. As described above, the conductive adhesive layer 24 is made of a metal or an alloy, thus having comparatively high reflectivity. Accordingly, although the reflective layer 22 is omitted, the luminance of the GaN light emitting diode 20 of the present invention can be improved by the reflectivity of the conductive adhesive layer 24.

This embodiment employs the silicon substrate 21 as a conductive substrate. However, various conductive substrates rather than the insulating sapphire substrate may be used in the present invention. Here, the conductive substrate of the present invention may be made of silicon, germanium (Ge), GaAs, etc.

The vertical GaN light emitting diode 20 of this embodiment is designed so that the upper and lower portions of the light emitting diode 20 are electrically connected to each other. A p-type contact 27 is formed on the entire lower surface of the silicon substrate 21, and an n-type contact 29 is formed on a portion of the upper surface of the n-type GaN clad layer 25c. Thereby, the vertical GaN light emitting diode shown in FIG. 2 is completely manufactured.

Compared to the vertical structure of the conventional GaN light emitting diode, the GaN light emitting diode 20 of this embodiment provides several advantages. First, since the GaN light emitting diode 20 of this embodiment uses the silicon substrate 21 instead of the sapphire substrate, the GaN light emitting diode 20 has improved heat emission efficiency, reduced forward voltage ($V_f$) by the current flowing over a broader area than the conventional vertical light emitting diode, and enhanced electrostatic discharge efficiency.

Further, in view of a manufacturing process, the GaN light emitting diode 20 of this embodiment has remarkably improved current density distribution, thus not requiring a step of forming a transparent electrode. Further, since the sapphire substrate is removed from the light emitting structure, a step of cutting the light emitting diode into a plurality of units can be simplified. Moreover, in view of the luminance of the light emitting diode, differently from the conventional vertical light emitting diode, the vertical light emitting diode of this embodiment does not require a step of selectively etching the active layer, thus obtaining a large-sized light emitting area and improved luminance.

Although the GaN light emitting diode 20 shown in FIG. 2 comprises the light emitting structure 25 including the active layer 25b, the n-type GaN clad layer 25c formed on the upper surface of the active layer 25b and the p-type GaN clad layer 25a formed on the lower surface of the active layer 25b, the light emitting structure 25 is not limited thereto. As is well known to those skilled in the art, types of the two clad layers may be reversed. In case the n-type GaN clad layer 25c is formed on the upper surface of the active surface 25b as described in this embodiment, since the n-type crystal layer has resistance lower than that of the p-type crystal layer, the current density distribution of the light emitting diode 20 is effectively improved.

Further, the present invention provides a method for manufacturing vertical GaN light emitting diodes.

FIGS. 3a to 3e are cross-sectional views illustrating a method for manufacturing a vertical GaN light emitting diode of the present invention. A plurality of the vertical GaN light emitting diodes are manufactured together using a wafer. However, FIGS. 3a to 3e illustrate a method for manufacturing a single GaN light emitting diode for a better understanding of the present invention.

Figure 3A:
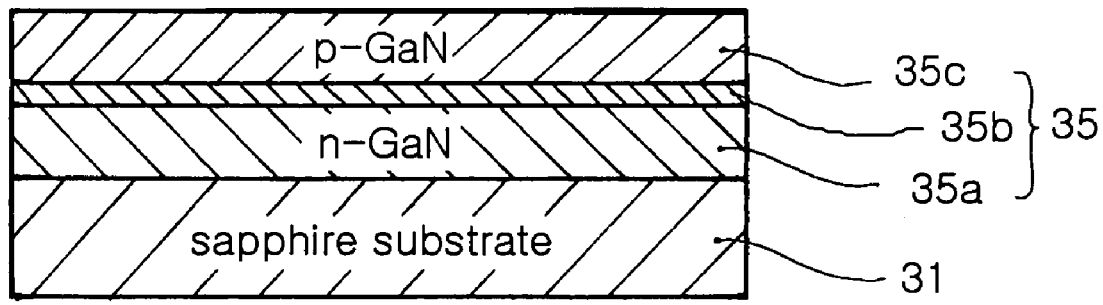
FIGS. 3a to 3e are cross-sectional views illustrating a method for manufacturing a GaN light emitting diode of the present invention.

As shown in FIG. 3a, the method for manufacturing the GaN light emitting diode of the present invention starts from a step of growing a single crystalline light emitting structure 35 on a sapphire substrate 31. As described above, the GaN light emitting structure 35 is grown on the sapphire substrate 31. In order to grow the GaN light emitting structure 35 with excellent crystalline quality on the sapphire substrate 31, a buffer layer (not shown) made of a GaN/AlN crystalline layer may be formed on the sapphire substrate 31 prior to the growing of the GaN light emitting structure 35.

In case that the n-type GaN clad layer 35a is disposed on the upper surface of the final structure of a light emitting diode, since the vertical structure of the diode is reversed, an n-type GaN clad layer 35a, an active layer 35b and a p-type GaN clad layer 35c are sequentially formed on the sapphire substrate 31 as shown in FIG. 3a.

Figure 3B:
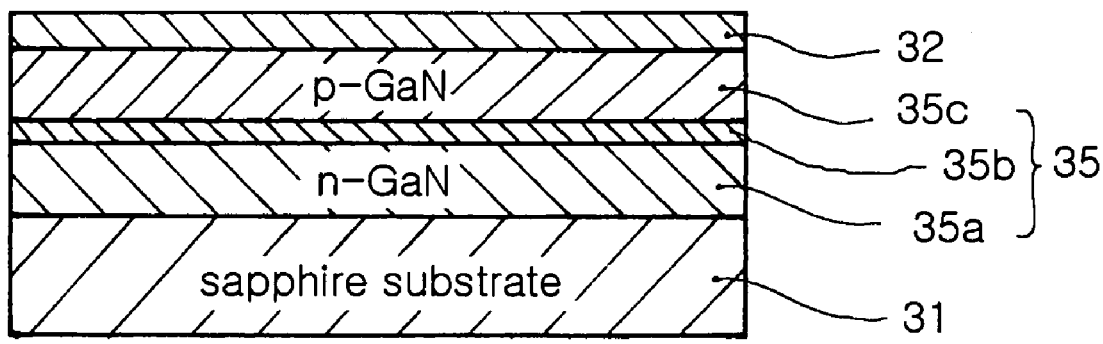

Subsequently, as shown in FIG. 3b, in order to improve the effective luminance of the GaN light emitting diode, a reflective layer 32 may be formed on the upper surface of the p-type GaN clad layer 35c. The reflective layer 32 is made of a metal with high reflectivity selected from the group consisting of Au, Ni, Ag, Al, and their alloys. The reflective layer 32 forms Ohmic contacts with the single crystal structures of other layers, thus allowing the current to pass through the GaN light emitting diode in a vertical direction. The reflective layer 32 is easily formed by means of a conventional sputtering apparatus.

Figure 3C:
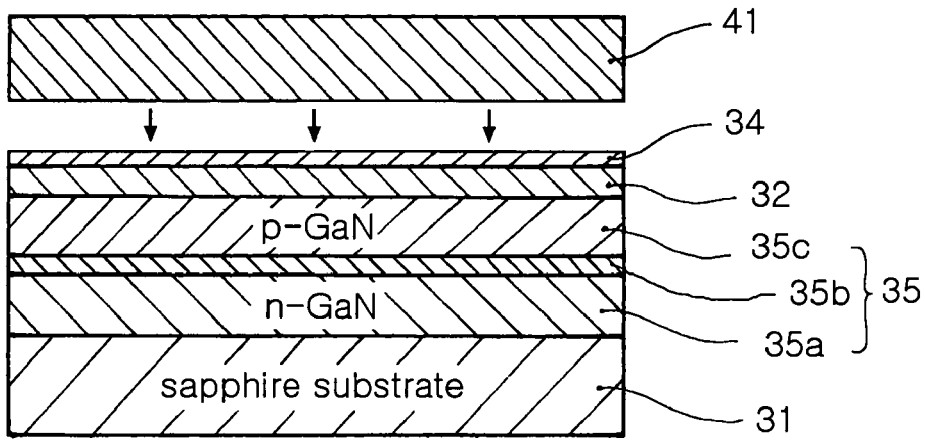

As shown in FIG. 3c, a conductive substrate 41 is attached to the reflective layer 32 using a conductive adhesive layer 34. In this step, the conductive adhesive layer 34 is formed in advance on the reflective layer 32 and then the conductive substrate 41 is attached to the conductive adhesive layer 34. However, the conductive adhesive layer 34 may be formed on the lower surface of the conductive substrate 41, and then the reflective layer 32 may be attached to the conductive adhesive layer 34. The conductive adhesive layer 34 is made of an alloy used in flip-chip bonding, and is preferably a material with a low melting point of approximately 200~300° C., which can be attached to the conductive adhesive layer 34 at a low temperature. In order to satisfy the above requirement, the conductive adhesive layer 34 is made of a material selected from the group consisting of Au—Sn, Sn, In, Au—Ag, and Pb—Sn.

Further, preferably, the conductive substrate 41 is made of a material such as silicon, germanium (Ge), and GaAs, on which an impurity is doped so as to have conductivity. In case that the formation of the reflective layer 32 shown in FIG. 3b is omitted, the conductive adhesive layer 34 may be formed directly on the p-type GaN clad layer 35c.

Figure 3D:
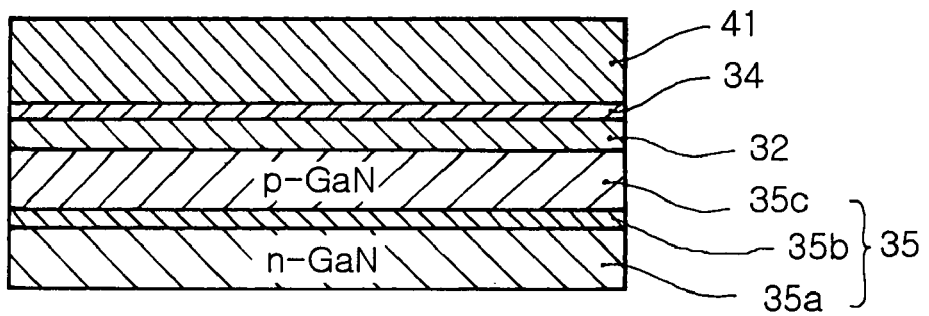

As shown in FIG. 3d, when the attachment of the conductive substrate 41 is completed, the sapphire substrate (31 of FIG. 3c) is removed from the light emitting structure 35. The sapphire substrate may be removed from the light emitting structure 35 using one of conventional techniques for removing a substrate, such as laser-beam welding, mechanical polishing, and chemical etching. The sapphire substrate has a very solid cubic crystal structure made of aluminum oxide ($Al_2O_3$). Thus, when the mechanical polishing or the chemical etching is used to remove the sapphire substrate, cost and time taken to remove the sapphire substrate from the light emitting structure are increased. Accordingly, there is generally used a method for removing the sapphire substrate 31 from the light emitting structure 35 using the difference of thermal coefficient of expansion (TCE) between the sapphire substrate 31 and the light emitting structure 35. A typical case of such a method is the above laser-beam welding.

However, the above method using heat such as the laser-beam welding damages the single crystal plane due to the lattice mismatching and the difference of thermal coefficient of expansion (TCE) among different layers, thus reducing the reliability of the final light emitting diode. The present invention also provides a concrete technique for separating the sapphire substrate from the GaN light emitting structure in order to solve the above problems, and the detailed description of this example will be given later.

Figure 3E:
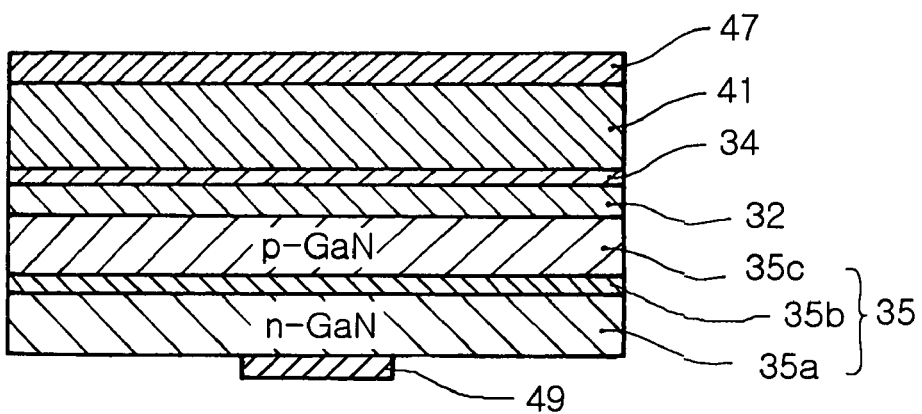

Lastly, as shown in FIG. 3e, the vertical GaN light emitting diode is completely manufactured by forming a p-type contact 47 on the exposed surface of the conductive substrate 41 and an n-type contact later 49 on the exposed surface of the n-type GaN clad layer 35a. As described above, the GaN light emitting diode of the present invention is formed to have a vertical structure, thus remarkably improving the reliability and the luminance thereof.

Although a process for manufacturing a single light emitting diode is described with reference to FIGS. 3a to 3e, a plurality of light emitting diodes are actually manufactured together using wafers. In this case, since the sapphire substrate is removed in advance before the wafer is cut into a plurality of light emitting diodes, an additional step is omitted and costs thereof are saved, thus simplifying the entire process.

In the method for manufacturing the vertical GaN light emitting diode of the present invention, the GaN single crystalline light emitting structure is grown on the sapphire substrate, the conductive substrate such as a silicon substrate is attached to the other side of the light emitting structure using the conductive adhesive layer, and then the sapphire substrate is removed from the light emitting structure. Accordingly, it is possible to manufacture the vertical GaN light emitting diode via a simple process.

The present invention also provides a preferred technique for more easily manufacturing the above vertical GaN light emitting diode with improved quality.

As described above, the step for removing the sapphire substrate from the light emitting structure is achieved by various conventional methods. However, there are many problems in applying these methods to practical use. Particularly, even the laser-beam welding proposed as a preferred method damages the GaN crystal plane due to the lattice mismatching and the difference of thermal coefficient of expansion (TCE) between the sapphire substrate and the light emitting structure during exposure to the laser beam.

Figure 4A:
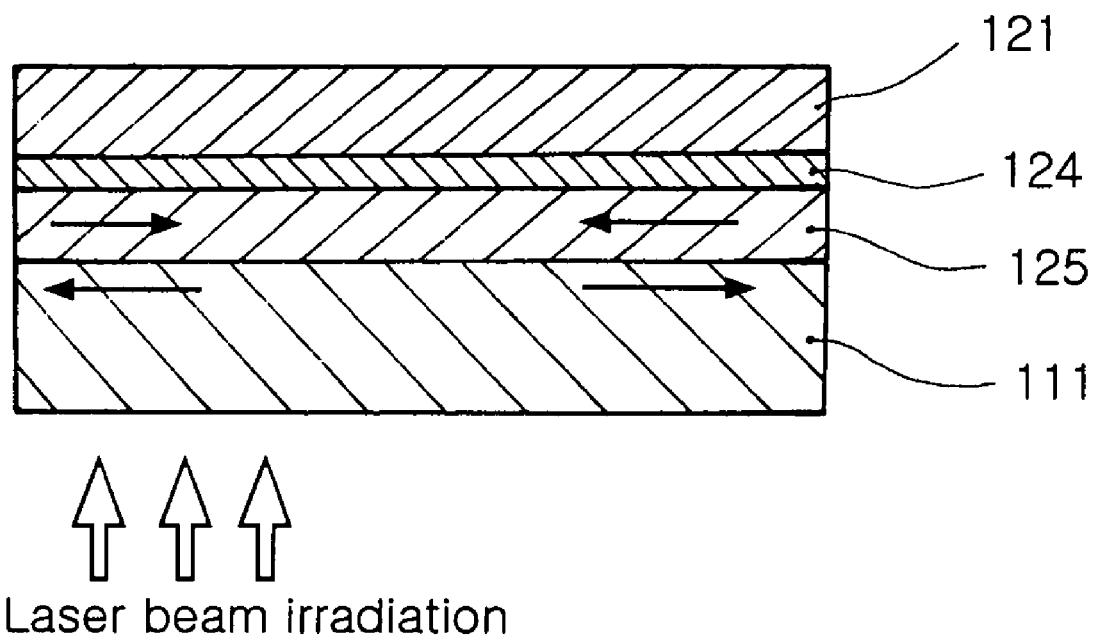
FIG. 4a is a cross-sectional view of a GaN single crystalline light emitting structure including a sapphire substrate in which residual stress is formed by irradiating a conventional laser beam thereon.

FIG. 4a is a cross-sectional view illustrating the step of removing the sapphire substrate from the light emitting structure using the conventional laser-beam welding.

With reference to FIG. 4a, a GaN single crystalline layer 125 for forming a light emitting structure is formed on a sapphire substrate 111, and a conductive substrate 121 such as a silicon substrate is formed on the GaN single crystalline layer 125 using a conductive adhesive layer 124. Here, differently from the structure shown in FIGS. 3a to 3e, a plurality of GaN light emitting diodes are formed on the sapphire substrate 111.

When a laser beam is irradiated on the lower surface of the sapphire substrate 111 in order to remove the sapphire substrate 111 from the GaN single crystalline layer 125, residual stress is exerted due to the difference of thermal coefficient of expansion between the sapphire substrate 111 and the GaN single crystalline layer 125, and the lattice mismatching thereof. That is, the thermal coefficient of expansion of sapphire is approximately $7.5 \times 10^{-6}$/K, while the thermal coefficient of expansion of GaN single crystal is approximately $5.9 \times 10^{-6}$/K. In this case, the rate of the lattice mismatching is approximately 16%. In case that a GAN/AlN buffer layer is formed on the sapphire substrate 111 prior to the growing of the GaN single crystalline layer 125, the rate of the lattice mismatching is several percent (%). Accordingly, when the heat is generated by exposure to the laser beam, large-sized compressive stress is exerted on the surface of the sapphire substrate 111 and large-sized tensile stress is exerted on the surface of the GaN single crystalline layer 125.

Particularly, since the area of the irradiation of the laser beam is small (maximally 10 mm×10 mm), the laser beam is repeatedly irradiated on sectional areas of the sapphire substrate 111 so that the laser beam can be irradiated on the entire surface of the sapphire substrate 111. Thereby, the level of stress becomes more serious, thus excessively damaging the surface of the GaN single crystalline layer 125.

Figure 4B:
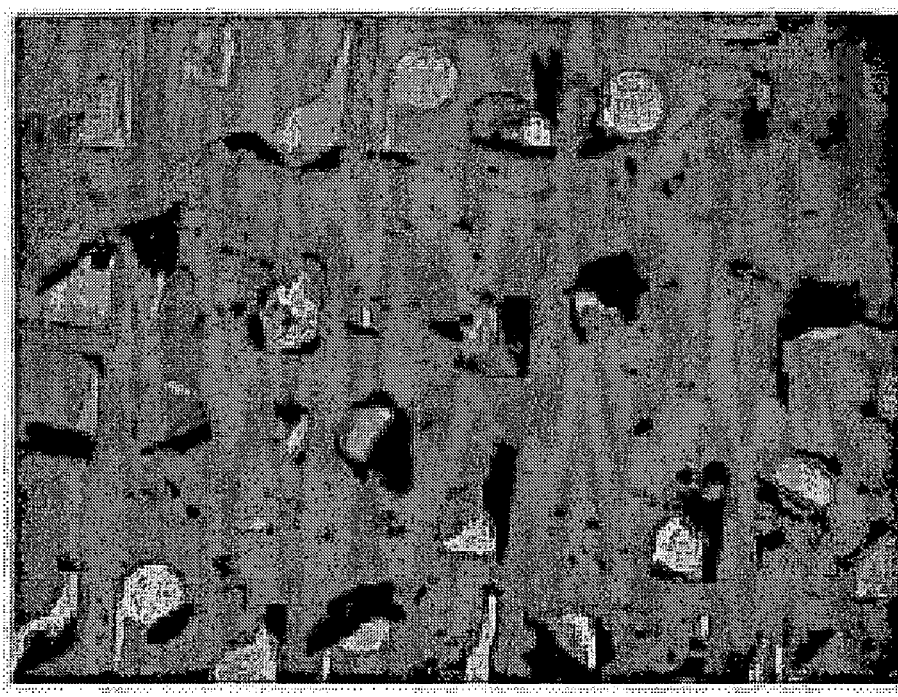
FIG. 4b illustrates the damaged surface of the GaN single crystalline light emitting structure in a conventional sapphire substrate removing step.

FIG. 4b illustrates the surface of the GaN single crystalline layer 125 damaged by residual stress exerted when the sapphire substrate 111 is removed from the GaN single crystalline layer 125 by a conventional separating method. With reference to FIG. 4b, it is noted that many parts of the surface of the GaN single crystalline layer 125 are broken due to the occurrence of the lattice mismatching and the difference of thermal coefficient of expansion (TCE) between the sapphire substrate 111 and the GaN single crystalline layer 125, when the sapphire substrate 111 is removed from the GaN single crystalline layer 125 using a laser beam.

Such a damaged crystal plane of the GaN single crystalline layer 125 remarkably deteriorates electrical properties of the manufactured GaN light emitting diode.

In order to solve the above problem, the method for manufacturing the GaN light emitting diode of the present invention comprises a new step of removing the sapphire substrate from the light emitting structure. In this step of removing the sapphire substrate from the light emitting structure in accordance with a preferred embodiment of the present invention, a GaN single crystalline layer on the sapphire substrate is cut into a plurality of units in advance so as to minimize stress negatively affecting the surface of the GaN single crystalline layer.

FIGS. 5a to 5e are cross-sectional views illustrating a step for removing a sapphire substrate from a light emitting structure in accordance with a preferred embodiment of the present invention.

Figure 5A:
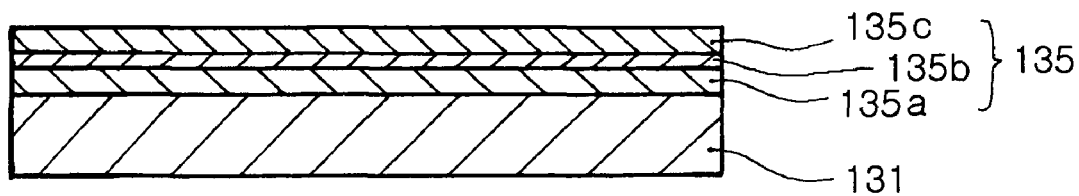
FIGS. 5a to 5f are cross-sectional views illustrating a step of removing the sapphire substrate in the preferred method for manufacturing GaN light emitting diodes of the present invention.

With reference to FIG. 5a, a light emitting structure 135 made of a GaN single crystalline layer is formed on a sapphire substrate 131. The GaN single crystalline layer of the light emitting diode 135 comprises an n-type GaN clad layer 135a, an active layer 135b, and a p-type GaN clad layer 135c.

Figure 5B:
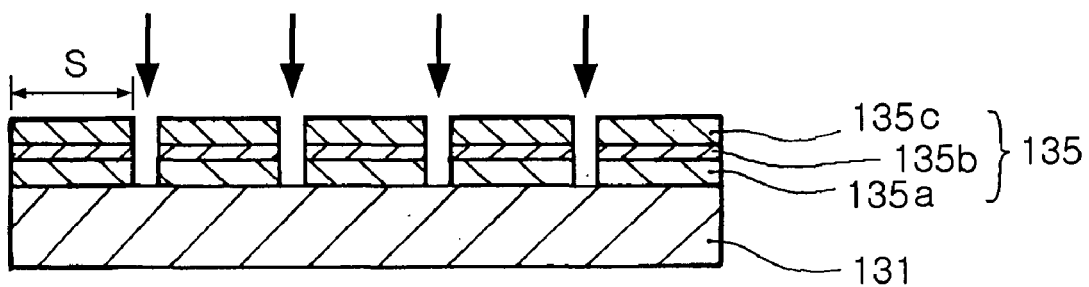

Subsequently, as shown in FIG. 5b, the GaN light emitting structure 135 is cut into a plurality of units so that each of the unit light emitting structures has a designated size (S). This embodiment does not require any additional step of cutting the GaN light emitting structure 135. Further, in order to reduce the size (S) of the unit light emitting structure so that the level of stress exerted on the unit light emitting structure by irradiating a laser beam thereon is minimized, the GaN light emitting structure 135 is preferably cut so that the size (S) of each of the unit light emitting structures corresponds to the size of a final light emitting diode to be manufactured. However, the size (S) of the unit light emitting structure is not limited thereto, but may be approximately equal to or less than the size of the area of the irradiation of the laser beam only if stress exerted on the GaN single crystal plane can be sufficiently reduced.

Figure 5C:
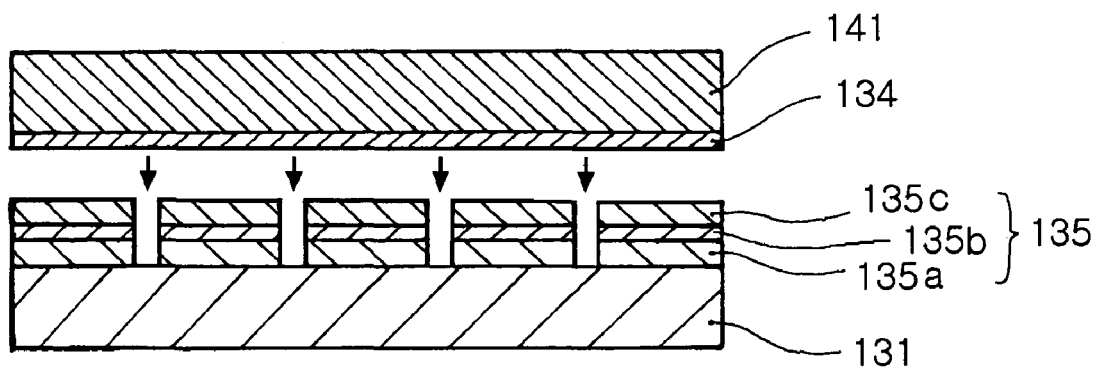

Then, as shown in FIG. 5c, a conductive substrate 141 is attached to the upper surface of the cut light emitting structure 135 using a conductive adhesive layer 134. Differently from the step shown in FIG. 3d, this step is achieved by forming the conductive adhesive layer 134 on the lower surface of the conductive substrate 141 and then attaching the other surface of the conductive adhesive layer 134 to the light emitting structure 135 (specifically, to the p-type GaN clad layer 135c). Since the conductive substrate 141 is attached to the upper surface of the cut light emitting structure 135, even if the sapphire substrate 131 is separated from the cut light emitting structure 135, the unit light emitting structures are stably arranged and maintained. Accordingly, it is possible to easily perform a subsequent step such as the forming of contacts using a mask under the condition that the unit light emitting structures are arranged. Further, in case that the conductive substrate 141 is attached directly to the light emitting structures 135 without any reflective layer, a metal material forming the conductive substrate 141 may serve as the reflective layer.

Figure 5D:
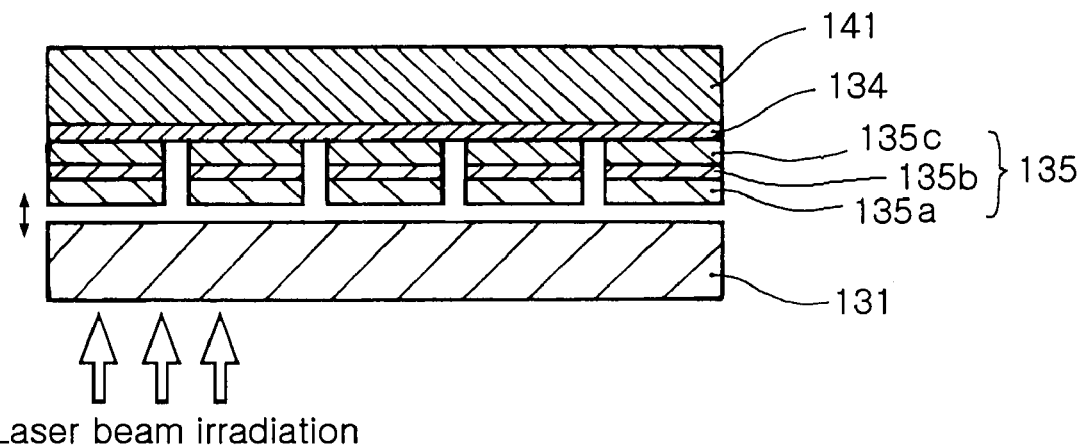

As shown in FIG. 5d, a laser beam is irradiated on the lower surface of the sapphire substrate 131 so that the sapphire substrate 131 is removed from the light emitting structure 135 using instantaneous stress occurring upon the irradiation of the laser beam. Here, the stress exerted on the interface between the sapphire substrate 131 and the light emitting structure 135 is in proportion to the size of the light emitting structure 135. Therefore, compared to the irradiation of the laser beam on a wafer with a large diameter, the irradiation of the laser beam on the small-sized unit light emitting structure reduces residual stress exerted on the interface of the sapphire substrate 131 and the light emitting structure 135.

Generally, since the area of irradiation of the laser beam is smaller than the size of the wafer, the laser beam was repeatedly irradiated on the conventional wafer. Therefore, in this embodiment, preferably, the size of the unit light emitting structure cut from the light emitting structure 135 in the step shown in FIG. 5b is at least the same as the area of the irradiation of the laser beam so that a part of the sapphire substrate is separated from a single unit light emitting structure by a single irradiation of the laser beam on the single unit light emitting structure.

Figure 5E:
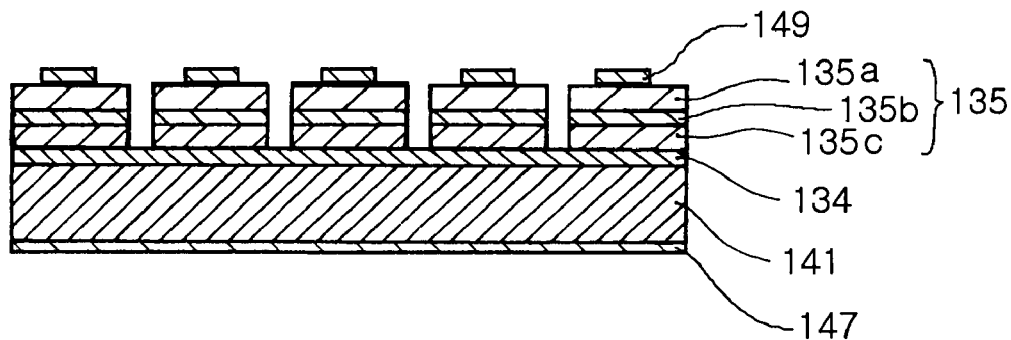

As shown in FIG. 5e, a contact forming step is performed on both surfaces of the resulting structure. FIG. 5e shows the inverted state of the resulting structure of FIG. 5d. Here, contacts are formed on the upper surfaces of the n-type GaN clad layer 135a of the unit light emitting structures 135 and the lower surface of the conductive substrate 141. An n-type contact 149 is formed on a designated area of the upper surface of each n-type GaN clad layer 135 (generally, the center of the upper surface), and a p-type contact 147 is formed on the entire lower surface of the conductive substrate 141.

Figure 5F:
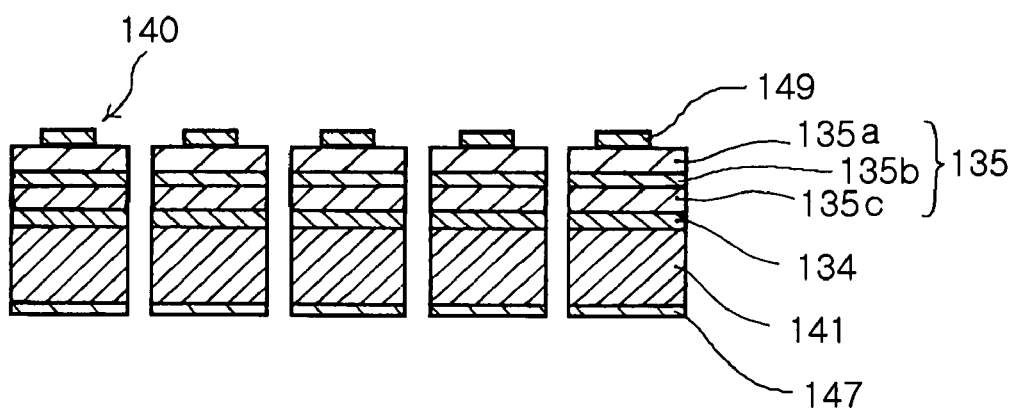

Finally, as shown in FIG. 5f, vertical GaN light emitting diodes 140 are obtained by cutting the resulting structure of FIG. 5e into plural units. Generally, a silicon substrate with strength smaller than that of the sapphire substrate is used as the conductive substrate 141, thus being easily cut.

In case that the light emitting structure 135 is cut into unit light emitting structures in advance so that the size of each of the unit light emitting structures is the same as that of the light emitting diode 140 to be manufactured as shown in FIG. 5b of this embodiment, plural unit vertical GaN light emitting diodes 140 are obtained only by cutting the conductive substrate 141. However, in case that the light emitting structure 135 is cut into unit light emitting structures in advance so that the size of each of the unit light emitting structures is the same as the area of the irradiation of the laser beam, the cutting of the light emitting structure 135 is performed together with the cutting of the conductive substrate 141.

As apparent from the above description, the present invention provides a vertical GaN light emitting diode, from which an insulating sapphire substrate is removed and in which a silicon substrate is installed, and a method for manufacturing the vertical GaN light emitting diodes, thus improving the heat emission, reducing the forward voltage due to the current flowing via an area broader than a conventional vertical GaN light emitting diode, and enhancing the electrostatic discharge effect.

Further, the method for manufacturing the GaN light emitting diodes of the present invention sufficiently improves the current density distribution, thus not requiring a step of forming a transparent electrode. The method of the present invention removes the sapphire substrate from a light emitting structure, thus simplifying a step of cutting the resulting structure into individual diodes.

Moreover, this method of the present invention does not require a step of selectively cutting an active layer, thus increasing the light emitting area and improving the luminance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A GaN light emitting diode, comprising:
a first conductive GaN clad layer which is a GaN crystalline layer doped with an n-type impurity;
a first contact formed on and in direct contact with an upper surface of the first conductive GaN clad layer;
an active layer formed on a lower surface of the first conductive GaN clad layer;
a second conductive GaN clad layer formed on a lower surface of the active layer, wherein the second conductive GaN clad layer is a GaN crystalline layer doped with a p-type impurity;
a conductive adhesive layer formed below the second conductive GaN clad layer;
a conductive substrate formed on a lower surface of the conductive adhesive layer;
a second contact formed on a lower surface of said conductive substrate; and
a reflective layer made of a conductive material and formed between and in direct contact with both the second conductive GaN clad layer and the conductive adhesive layer;
wherein
the conductive adhesive layer is made of a material selected from the group consisting of Au—Sn, Sn, In, Au—Ag and Pb—Sn; and
the reflective layer has a uniform thickness and covers the entire lower surface of the second conductive GaN clad layer, the reflective layer being in direct and ohmic contact with the second conductive GaN clad layer throughout the entire lower surface of the second conductive GaN clad layer.

2. The GaN light emitting diode as set forth in claim 1, wherein the reflective layer is made of a material selected from the group consisting of Au, Ni, Ag, Al and alloys thereof.

3. The GaN light emitting diode as set forth in claim 1, wherein the conductive substrate is made of a material selected from the group consisting of silicon (Si), germanium (Ge) and GaAs.

4. The GaN light emitting diode as set forth in claim 1, wherein the active layer is in direct contact with the lower surface of the first conductive GaN clad layer.

5. The GaN light emitting diode as set forth in claim 1, wherein the active layer is in direct contact with the lower surface of the first conductive GaN clad layer.

6. The GaN light emitting diode as set forth in claim 5, wherein the second contact is in direct contact with and covers the entire lower surface of said conductive substrate.

7. The GaN light emitting diode as set forth in claim 1, further comprising
- an upper surface defined together by said first contact and said upper surface of the first conductive GaN clad layer;
- a lower surface defined by a lower surface of said second contact; and
- opposite side surfaces extending between and connecting said upper and lower surfaces of said diode;

wherein the reflective layer extends continuously without interruption from one of said side surfaces to the opposite one of side surfaces.

8. The GaN light emitting diode as set forth in claim 7, wherein the active layer is in direct contact with the lower surface of the first conductive GaN clad layer.

9. The GaN light emitting diode as set forth in claim 8, wherein the second contact is in direct contact with and covers the entire lower surface of said conductive substrate.

* * * * *